United States Patent
Farmer et al.

(10) Patent No.: US 11,545,641 B2
(45) Date of Patent: Jan. 3, 2023

(54) N-TYPE END-BONDED METAL CONTACTS FOR CARBON NANOTUBE TRANSISTORS

(71) Applicant: International Business Machines Corporation, Armonk, NY (US)

(72) Inventors: Damon B. Farmer, White Plains, NY (US); Shu-Jen Han, Cortlandt Manor, NY (US); Jianshi Tang, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 16/807,488

(22) Filed: Mar. 3, 2020

(65) Prior Publication Data
US 2020/0203646 A1   Jun. 25, 2020

Related U.S. Application Data

(62) Division of application No. 15/210,491, filed on Jul. 14, 2016, now Pat. No. 10,665,799.

(51) Int. Cl.
| | | |
|---|---|---|
| *H01L 51/10* | (2006.01) | |
| *H01L 51/00* | (2006.01) | |
| *H01L 51/05* | (2006.01) | |

(52) U.S. Cl.
CPC ........ *H01L 51/105* (2013.01); *H01L 51/0026* (2013.01); *H01L 51/0048* (2013.01);
(Continued)

(58) Field of Classification Search
CPC ............. H01L 51/0026; H01L 51/0048; H01L 51/0545; H01L 51/0558; H01L 51/105;
(Continued)

(56) References Cited

U.S. PATENT DOCUMENTS

| | | | |
|---|---|---|---|
| 6,692,791 B2 * | 2/2004 | Chang | B82Y 10/00 |
| | | | 427/282 |
| 6,706,566 B2 | 3/2004 | Avouris et al. | |
| | | (Continued) | |

FOREIGN PATENT DOCUMENTS

WO    WO 2015/164749    * 10/2015    ........... H01L 29/775

OTHER PUBLICATIONS

Bobba et al., "Design of a Cnfetarray for Sensing and Control in P450 Based Biochips for Multiple Drug Detection,"IEEE (2010).*
(Continued)

*Primary Examiner* — Jay C Kim
(74) *Attorney, Agent, or Firm* — Robert Sullivan; Ryan, Mason & Lewis, LLP

(57) ABSTRACT

A method for manufacturing a semiconductor device includes forming a first dielectric layer on a substrate, forming a carbon nanotube (CNT) layer on the first dielectric layer, forming a second dielectric layer on the carbon nanotube (CNT) layer, patterning a plurality of trenches in the second dielectric layer exposing corresponding portions of the carbon nanotube (CNT) layer, forming a plurality of contacts respectively in the plurality of trenches on the exposed portions of the carbon nanotube (CNT) layer, performing a thermal annealing process to create end-bonds between the plurality of the contacts and the carbon nanotube (CNT) layer, and depositing a passivation layer on the plurality of the contacts and the second dielectric layer.

19 Claims, 4 Drawing Sheets

(52) U.S. Cl.
CPC ........ *H01L 51/0545* (2013.01); *H01L 51/107*
(2013.01); *H01L 51/0558* (2013.01); *H01L 2251/301* (2013.01); *H01L 2251/303* (2013.01)

(58) Field of Classification Search
CPC ............... H01L 51/107; H01L 51/0017; H01L 2251/301; H01L 2251/303
See application file for complete search history.

(56) References Cited

U.S. PATENT DOCUMENTS

| | | | |
|---|---|---|---|
| 6,723,624 B2 | 4/2004 | Wang et al. | |
| 6,891,227 B2* | 5/2005 | Appenzeller | B82Y 10/00 257/346 |
| 6,894,359 B2* | 5/2005 | Bradley | B82Y 15/00 257/253 |
| 6,933,222 B2 | 8/2005 | Dubin et al. | |
| 7,076,871 B2 | 7/2006 | Horiuchi et al. | |
| 7,141,727 B1 | 11/2006 | Appenzeller et al. | |
| 7,233,071 B2 | 6/2007 | Furukawa et al. | |
| 7,253,065 B2 | 8/2007 | Appenzeller et al. | |
| 7,253,431 B2 | 8/2007 | Afzali-Ardakani et al. | |
| 7,402,736 B2* | 7/2008 | Moon | G11B 9/1409 438/551 |
| 7,482,232 B2* | 1/2009 | Appenzeller | B82Y 10/00 438/276 |
| 7,492,015 B2 | 2/2009 | Chen et al. | |
| 7,598,516 B2 | 10/2009 | Avouris et al. | |
| 7,714,386 B2 | 5/2010 | Pesetski et al. | |
| 7,732,859 B2 | 6/2010 | Anderson et al. | |
| 7,772,584 B2* | 8/2010 | Orlowski | H01L 23/53276 257/10 |
| 7,786,024 B2 | 8/2010 | Stumbo et al. | |
| 7,786,466 B2 | 8/2010 | Appenzeller et al. | |
| 7,847,588 B2 | 12/2010 | Bertin | |
| 7,897,960 B2 | 3/2011 | Appenzeller et al. | |
| 7,902,089 B2* | 3/2011 | Matsumoto | H01L 21/02271 438/791 |
| 8,004,043 B2 | 8/2011 | Keshavarzi et al. | |
| 8,022,725 B2 | 9/2011 | Kim et al. | |
| 8,058,112 B2* | 11/2011 | Ishida | B82Y 10/00 438/142 |
| 8,063,451 B2 | 11/2011 | Zhang et al. | |
| 8,120,008 B2 | 2/2012 | Peng et al. | |
| 8,125,824 B1* | 2/2012 | Ward | G11C 13/025 365/182 |
| 8,193,032 B2* | 6/2012 | Chen | H01L 29/78684 438/105 |
| 8,227,799 B2 | 7/2012 | Liu et al. | |
| 8,288,759 B2 | 10/2012 | Chen et al. | |
| 8,288,804 B2 | 10/2012 | Kikuchi et al. | |
| 8,297,351 B2 | 10/2012 | Yoshiuchi et al. | |
| 8,354,291 B2 | 1/2013 | Zhou et al. | |
| 8,362,525 B2 | 1/2013 | Bertin et al. | |
| 8,405,189 B1* | 3/2013 | Ward | H01G 4/08 257/532 |
| 8,420,474 B1 | 4/2013 | Frank et al. | |
| 8,421,129 B2* | 4/2013 | Ishida | H01L 29/0665 257/287 |
| 8,445,893 B2 | 5/2013 | Meric et al. | |
| 8,471,249 B2 | 6/2013 | Chiu et al. | |
| 8,487,297 B2 | 7/2013 | Subagyo et al. | |
| 8,502,277 B2 | 8/2013 | Matsumoto et al. | |
| 8,580,586 B2 | 11/2013 | Bertin et al. | |
| 8,609,481 B1 | 12/2013 | Franklin et al. | |
| 8,610,125 B2 | 12/2013 | Kastalsky | |
| 8,610,989 B2 | 12/2013 | Avouris et al. | |
| 8,617,941 B2 | 12/2013 | Farmer et al. | |
| 8,624,224 B2 | 1/2014 | Kastalsky | |
| 8,629,010 B2 | 1/2014 | Avouris et al. | |
| 8,631,562 B2* | 1/2014 | Bertin | H01L 23/62 29/622 |
| 8,642,996 B2* | 2/2014 | Cohen | H01L 21/02636 257/27 |
| 8,659,009 B2* | 2/2014 | Ozyilmaz | H01L 29/78684 257/40 |
| 8,680,646 B2* | 3/2014 | Guo | H01L 51/0525 257/510 |
| 8,692,230 B2* | 4/2014 | Zhou | B82Y 10/00 257/29 |
| 8,698,226 B2* | 4/2014 | Jain | G01N 27/4146 257/317 |
| 8,742,478 B2* | 6/2014 | Chung | H01L 29/78684 977/734 |
| 8,785,911 B2* | 7/2014 | Chen | H01L 51/0023 257/29 |
| 8,796,096 B2 | 8/2014 | Farmer et al. | |
| 8,901,666 B1 | 12/2014 | Meade et al. | |
| 8,963,215 B2 | 2/2015 | Afzali-Ardakani et al. | |
| 8,968,540 B2* | 3/2015 | Reinhart | G01N 33/48721 204/452 |
| 8,969,118 B2 | 3/2015 | Afzali-Ardakani et al. | |
| 8,975,095 B2 | 3/2015 | Han et al. | |
| 9,006,044 B2* | 4/2015 | Lee | H01L 21/6835 977/734 |
| 9,040,364 B2 | 5/2015 | Farmer et al. | |
| 9,082,856 B2 | 7/2015 | Chen et al. | |
| 9,103,755 B2 | 8/2015 | Laugharn, Jr. et al. | |
| 9,103,775 B2* | 8/2015 | Bradley | H01L 29/0665 |
| 9,159,938 B2* | 10/2015 | Zou | H01L 21/02134 |
| 9,177,688 B2 | 11/2015 | Bol et al. | |
| 9,209,246 B2 | 12/2015 | Fonash et al. | |
| 9,246,112 B2* | 1/2016 | Franklin | H01L 51/0554 |
| 9,263,685 B2* | 2/2016 | Li | H01L 51/0558 |
| 9,287,356 B2* | 3/2016 | Bertin | H01L 29/0676 |
| 9,287,516 B2 | 3/2016 | Cao et al. | |
| 9,299,939 B1 | 3/2016 | Cao et al. | |
| 9,437,677 B2 | 9/2016 | Guo et al. | |
| 9,543,535 B1 | 1/2017 | Afzali-Ardakani et al. | |
| 9,577,204 B1* | 2/2017 | Han | H01L 51/0048 |
| 9,613,879 B2 | 4/2017 | Hersam et al. | |
| 9,634,251 B2* | 4/2017 | Roberts | C01B 32/17 |
| 9,660,806 B2* | 5/2017 | Haensch | G09C 1/00 |
| 9,748,334 B1 | 8/2017 | Bangsarntip et al. | |
| 9,767,902 B2* | 9/2017 | Bertin | G11C 11/56 |
| 9,786,852 B2* | 10/2017 | Franklin | H01L 51/0545 |
| 9,806,084 B1* | 10/2017 | Cheng | H01L 23/5252 |
| 9,859,500 B2* | 1/2018 | Afzali-Ardakani | H01L 51/0048 |
| 9,882,008 B2 | 1/2018 | Colombo et al. | |
| 9,899,378 B2 | 2/2018 | Cheng | H01L 21/823437 |
| 9,923,142 B2* | 3/2018 | Chen | H01L 21/0262 |
| 10,003,028 B2* | 6/2018 | Barth | H01L 21/486 |
| 10,032,920 B2* | 7/2018 | Hamaguchi | H01L 29/66765 |
| 10,061,173 B2 | 8/2018 | Zhang et al. | |
| 10,177,199 B2 | 1/2019 | Zhao et al. | |
| 10,319,926 B2 | 6/2019 | Cao et al. | |
| 10,367,158 B2 | 7/2019 | Han et al. | |
| 10,396,300 B2 | 8/2019 | Han et al. | |
| 10,553,711 B2* | 2/2020 | Lemaitre | H01L 29/1606 |
| 2004/0238887 A1 | 12/2004 | Nihey | |
| 2005/0056825 A1 | 3/2005 | Bertin et al. | |
| 2005/0212014 A1* | 9/2005 | Horibe | G01N 27/4146 257/213 |
| 2005/0224888 A1 | 10/2005 | Graham et al. | |
| 2007/0063304 A1* | 3/2007 | Matsumoto | H01L 29/7613 257/462 |
| 2011/0147714 A1* | 6/2011 | Hong | H01L 29/78696 257/24 |
| 2012/0280213 A1 | 11/2012 | Gau et al. | |
| 2014/0225058 A1 | 8/2014 | Okada et al. | |
| 2015/0348667 A1 | 12/2015 | Bol et al. | |
| 2016/0132296 A1* | 5/2016 | Park | H04L 9/0866 708/255 |
| 2017/0133609 A1 | 5/2017 | Cao et al. | |
| 2017/0244039 A1* | 8/2017 | Afzali-Ardakani | C01B 32/158 |

(56) References Cited

OTHER PUBLICATIONS

Sayed et al., "Optimization of CNFET Parameters for High Performance Digital Circuits," Advances in Materials Science and Engineering vol. 2016, Article ID 6303725 (2016).*
Franklin et al. "Length scaling of carbon nanotube transistors," Nature Nanotechnology 5 (2010) pp. 858-862.*
Jin et al., "Sources of Hysteresis in Carbon Nanotube Field-Effect Transistors and Their Elimination Via Methylsiloxane Encapsulants and Optimized Growth Procedures," Advanced Functional Materials 22 (2012) pp. 2276-2284.*
Moaiyeri et al., "An efficient ternary serial adder based on carbon nanotube FETs," Engineering Science and Technology 19 (2016) pp. 271-278.*
Azimi et al., "Designing a Novel Ternary Multiplier Using CNTFET," International Journal of Modern Education and Computer Science 11 (2014) pp. 45-51.*
Lefebvre et al., "Hysteresis free carbon nanotube thin film transistors comprising hydrophobic dielectrics," Applied Physics Letters 107 (2015) 243301.*
Florian Banhart, "Interactions Between Metals and Carbon Nanotubes: at the Interface Between Old and New Materials," Nanoscale, Aug. 28, 2009, pp. 201-213, vol. 1.
J.J. Cha et al., "Three-Dimensional Imaging of Carbon Nanotubes Deformed by Metal Islands," Nano Letters, Nov. 7, 2007, pp. 3770-3773, vol. 7, No. 12.
V. Perebeinos et al., "Carbon Nanotube Deformation and Collapse under Metal Contacts," Nano Letters, Jul. 11, 2014, pp. 4376-4380, vol. 14, No. 8.
Q. Cao et al., "End-Bonded Contacts for Carbon Nanotube Transistors with Low, Size-Independent Resistance," Science, Oct. 2, 2015, pp. 68-72, vol. 350, No. 6256.
Q. Cao et al., "End-Bonded Contacts for Carbon Nanotube Transistors with Low, Size-Independent Resistance," Science, Oct. 2, 2015, pp. 68-72, vol. 350, No. 6256 (Supplementary Material).
Y. Zhang et al., "Heterostructures of Single-Walled Carbon Nanotubes and Carbide Nanorods," Science, Sep. 10, 1999, pp. 1719-1722, vol. 285, No. 5434.
T.-J. Ha et al., "Highly Uniform and Stable n-Type Carbon Nanotube Transistors by Using Positively Charged Silicon Nitride Thin Films," Nano Letters, Dec. 1, 2014, pp. 392-397, vol. 15, No. 1.
T.-J. Ha et al., "Highly Uniform and Stable n-Type Carbon Nanotube Transistors by Using Positively Charged Silicon Nitride Thin Films," Nano Letters, Dec. 1, 2014, pp. 392-397, vol. 15, No. 1 (Supporting Information).
Z. Zhang et al., "Reverse Degradation of Nickel Graphene Junction by Hydrogen Annealing," AIP Advances, Jan. 2016, 8 pages, vol. 6.

Y. Che et al., "Review of Carbon Nanotube Nanoelectronics and Macroelectronics," Semiconductor Science and Technology, May 1, 2014, 17 pages, vol. 29, No. 7.
K. Grigoras et al., "Atomic Layer Deposition of Aluminum Oxide Films for Carbon Nanotube Network Transistor Passivation," Journal of Nanoscience and Nanotechnology, Oct. 2011, pp. 8818-8825, vol. 11, No. 10.
T. Helbling et al., "Long Term Investigations of Carbon Nanotube Transistors Encapsulated by Atomic-Layer-Deposited Al2O3 for Sensor Applications," Nanotechnology, Oct. 2, 2009, 10 pages, vol. 20, No. 43.
Mike Orcutt, "IBM Reports Carbon Nanotube Transistor Breakthrough," https://www.hpcwire.com/2015/10/01/ibm-reports-carbon-nanotube-transistor-breakthrough, Oct. 1, 2015, 3 pages.
A. Javey et al., "Carbon Nanotube Field-Effect Transistors with Integrated Ohmic Contacts and High-κ Gate Dielectrics," Nano Letters, Feb. 20, 2004, pp. 447-450, vol. 4, No. 3.
J. Kim et al., "Controlling the Electronic Properties of SWCNT FETs via Modification of the Substrate Surface Prior to Atomic Layer Deposition of 10 nm Thick Al2O3 Film," Nanotechnology, Oct. 18, 2013, 10 pages, vol. 24, No. 45.
Z. Kordrostami et al., "Fundamental Physical Aspects of Carbon Nanotube Transistors," www.intechopen.com, Mar. 2010, pp. 169-186.
F. Léonard et al., "Electrical Contacts to One- and Two-Dimensional Nanomaterials," Nature Nanotechnology, Nov. 26, 2011, pp. 773-783, vol. 6, No. 12.
J.A. Misewich et al., "Electrically Induced Optical Emission from a Carbon Nanotube FET," Science, May 2, 2003, pp. 783-786, vol. 300, No. 5620.
J.A. Rodriguez-Manzo et al., "Heterojunctions Between Metals and Carbon Nanotubes as Ultimate Nanocontacts," Proceedings of the National Academy of Sciences of the United States of America (PNAS), Mar. 24, 2009, pp. 4591-4595, vol. 106, No. 12.
M. Schröter et al., "Carbon Nanotube FET Technology for Radio-Frequency Electronics: State-of-the-Art Overview," IEEE Journal of the Electron Devices Society, Jan. 2013, pp. 9-20, vol. 1, No. 1.
C. Wang et al., "Carbon Nanotube Electronics—Moving Forward," Chemical Society Reviews, Apr. 7, 2013, pp. 2592-2609, vol. 42, No. 7.
M.J. Young et al., "Growth and Characterization of Al2O3 Atomic Layer Deposition Films on sp2-Graphitic Carbon Substrates Using NO2/Trimethylaluminum Pretreatment," ACS Applied Materials & Interfaces, May 12, 2015, pp. 12030-12037, vol. 7, No. 22.
M.Y. Zavodchikova et al., "Carbon Nanotube Thin Film Transistors Based on Aerosol Methods," Nanotechnology, Feb. 2, 2009, 9 pages, vol. 20, No. 8.
List of IBM Patents or Patent Applications Treated as Related.

* cited by examiner

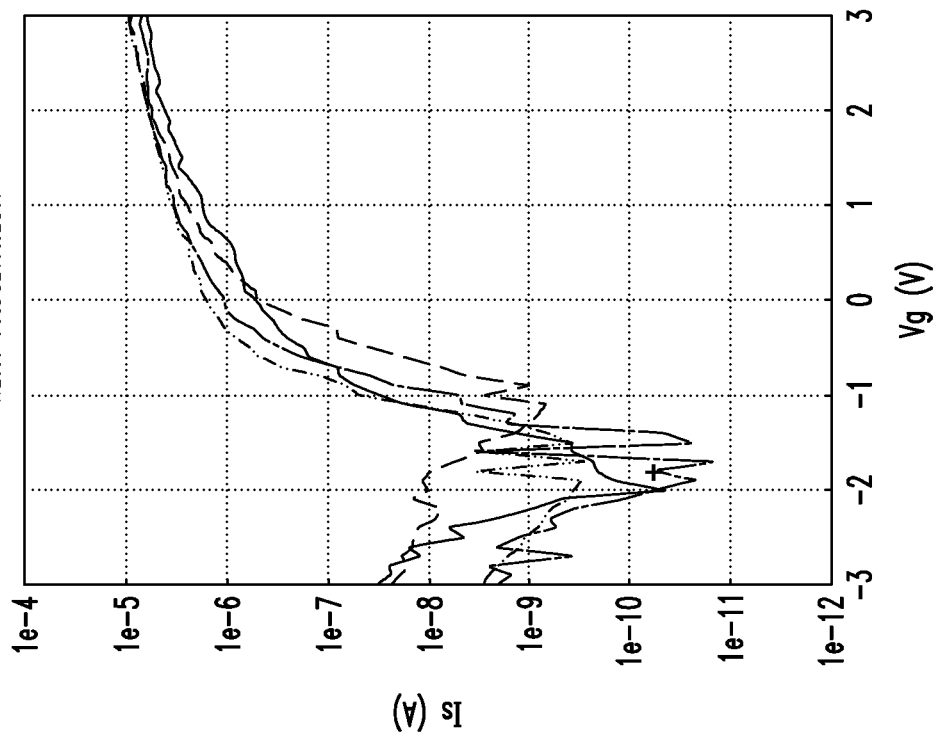
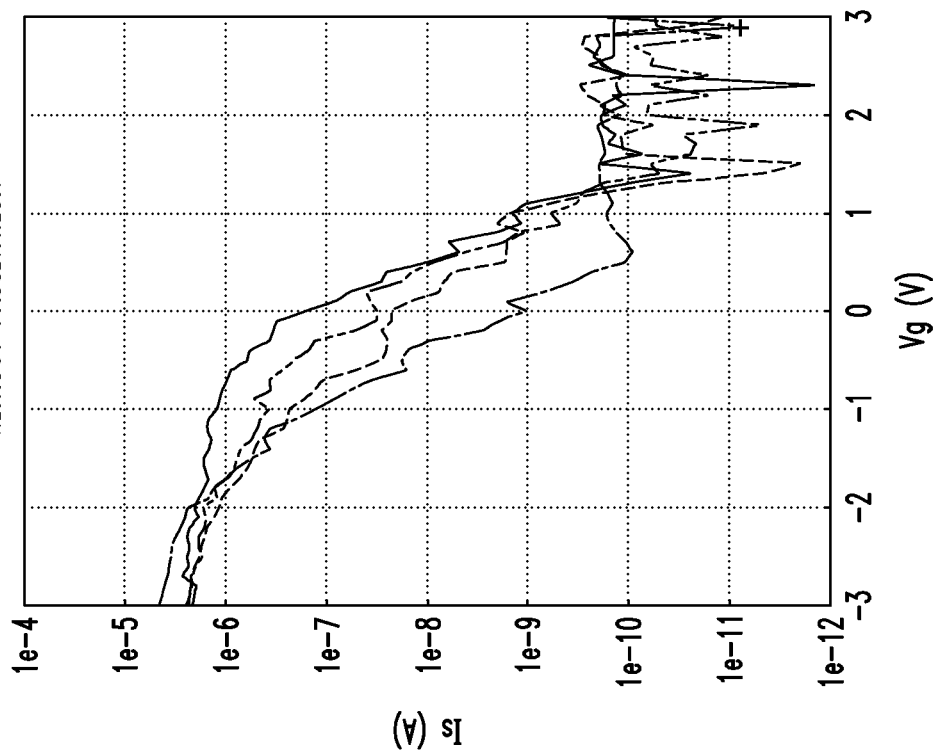

N-TYPE END-BONDED METAL CONTACTS FOR CARBON NANOTUBE TRANSISTORS

CROSS-REFERENCE TO RELATED APPLICATION

This application is a divisional of U.S. patent application Ser. No. 15/210,491, filed on Jul. 14, 2016, which is related to U.S. patent application Ser. No. 15/210,463, filed on Jul. 14, 2016, which is commonly assigned, and entitled "Carbon Nanotube Transistor And Logic With End-Bonded Metal Contacts", the complete disclosures of which are expressly incorporated herein by reference in their entireties for all purposes.

TECHNICAL FIELD

The field generally relates to semiconductor devices and methods of manufacturing same and, in particular, to forming n-type end-bonded metal contacts to carbon nanotubes (CNTs).

BACKGROUND

A metal-oxide-semiconductor field-effect transistor (MOSFET) is a transistor used for amplifying or switching electronic signals, and includes a metal oxide gate electrode. N-type field effect transistors (NFETs) and p-type field effect transistors (PFETs) are two types of complementary MOSFETs. An NFET includes n-doped source/drain regions and utilizes electrons as current carriers, whereas a PFET includes p-doped source/drain regions and uses holes as current carriers.

Complementary metal-oxide semiconductor (CMOS) technology is being continuously scaled down with respect to device channel length and contact length. As the channel length reaches tens of nanometers, contact resistance can become comparable with channel resistance, and gradually limit transistor drive current.

Due to its superior electrical properties and intrinsic ultra-thin body, carbon nanotube (CNT) is widely considered as one of the most promising candidates to replace silicon for sub-5 nm technology nodes. CNT-based CMOS technology requires a scalable transistor channel and scalable and robust source/drain contacts for both PFETs and NFETs. For this purpose, end-bonded source/drain metal contacts to CNTs, featuring a length-independent contact resistance, represent a preferred contact scheme over side contacts for scaled technology nodes.

SUMMARY

According to an exemplary embodiment of the present invention, a method for manufacturing a semiconductor device includes forming a first dielectric layer on a substrate, forming a carbon nanotube (CNT) layer on the first dielectric layer, forming a second dielectric layer on the carbon nanotube (CNT) layer, patterning a plurality of trenches in the second dielectric layer exposing corresponding portions of the carbon nanotube (CNT) layer, forming a plurality of contacts respectively in the plurality of trenches on the exposed portions of the carbon nanotube (CNT) layer, performing a thermal annealing process to create end-bonds between the plurality of the contacts and the carbon nanotube (CNT) layer, and depositing a passivation layer on the plurality of the contacts and the second dielectric layer.

According to an exemplary embodiment of the present invention, a semiconductor device includes a first dielectric layer on a substrate, a carbon nanotube (CNT) layer on the first dielectric layer, a second dielectric layer on the carbon nanotube (CNT) layer, a plurality of contacts end-bonded to the carbon nanotube (CNT) layer, wherein the plurality of the contacts are positioned in a plurality of trenches in the second dielectric layer, and a passivation layer on the plurality of the contacts and the second dielectric layer.

According to an exemplary embodiment of the present invention, a method for manufacturing a semiconductor device includes forming a first dielectric layer on a substrate, forming a carbon nanotube (CNT) layer on the first dielectric layer, forming a second dielectric layer on the carbon nanotube (CNT) layer, patterning a plurality of trenches in the second dielectric layer exposing corresponding portions of the carbon nanotube (CNT) layer, forming a plurality of p-type contacts respectively in the plurality of trenches on the exposed portions of the carbon nanotube (CNT) layer, performing a thermal annealing process to create end-bonds between the plurality of the p-type contacts and the carbon nanotube (CNT) layer, and depositing a passivation layer on the plurality of the p-type contacts and the second dielectric layer, wherein the plurality of the p-type contacts are converted to n-type contacts.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIGS. 7A and 7B show graphs of source/drain current versus gate voltage of several CNT transistors in connection with end-bonded metal contacts without the passivation layer and with the passivation layer, according to an exemplary embodiment of the present invention.

DETAILED DESCRIPTION

Figure 1:
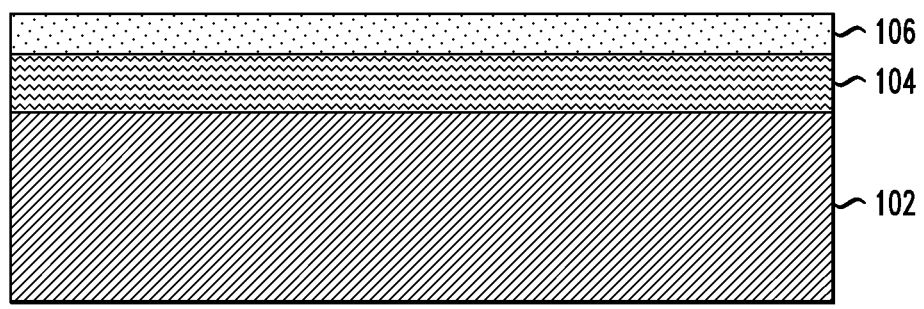
FIG. 1 is a cross-sectional view illustrating a carbon nanotube (CNT) layer on a dielectric layer on a substrate in a method for manufacturing a semiconductor device, according to an exemplary embodiment of the present invention.

Exemplary embodiments of the invention will now be discussed in further detail with regard to semiconductor devices and methods of manufacturing same and, in particular, to forming n-type end-bonded metal contacts to carbon nanotubes (CNTs).

While there exist approaches to making p-type end-bonded contacts to CNTs, methods of making devices and devices incorporating robust n-type end-bonded contacts to CNTs are needed. Embodiments of the present invention relate to a method of forming robust n-type end-bonded metal contacts to CNTs by depositing a passivation layer on originally p-type contacts. The passivation layer functions as an n-type physicochemical doping layer.

It is to be understood that the various layers and/or regions shown in the accompanying drawings are not drawn to scale, and that one or more layers and/or regions of a type commonly used in complementary metal-oxide semiconductor (CMOS), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require CMOSs, MOSFETs and/or other types of FETs. By way of non-limiting example, the semiconductor devices can include, but are not limited to CMOS and MOSFET devices, and/or semiconductor devices that use CMOS and MOSFET technology.

As used herein, "height" refers to a vertical size of an element (e.g., a layer, trench, hole, etc.) in the cross-sectional views measured from a bottom surface to a top surface of the element, and/or measured with respect to a surface on which the element is directly on. Conversely, a "depth" refers to a vertical size of an element (e.g., a layer, trench, hole, etc.) in the cross-sectional and three-dimensional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to a substrate in the cross-sectional views, and "horizontal" refers to a direction parallel to a substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

FIG. 1 is a cross-sectional view illustrating a carbon nanotube (CNT) layer on a dielectric layer on a substrate in a method for manufacturing a semiconductor device, according to an exemplary embodiment of the present invention. Referring to FIG. 1, the semiconductor device includes a substrate 102 with a dielectric layer 104 formed on the substrate 102. The substrate can be, for example, a silicon, a silicon germanium, or any other substrate, and can include dopants such as p-type dopants, including, but not necessarily limited to, boron, n-type dopants, including, but not necessarily limited to, phosphorus, or any combination thereof. Non-limiting examples of the substrate 102 materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof.

The dielectric layer 104 can be deposited on the substrate 102 using deposition techniques, including, but not necessarily limited to, chemical vapor deposition (CVD), plasma-enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), and/or liquid source misted chemical deposition (LSMCD), sputtering, and/or plating. The dielectric layer 104 can be formed of a high-k gate dielectric. In some aspects, the dielectric layer can include a low-k dielectric oxide, including but not limited to, spin-on-glass, a flowable oxide, a high density plasma oxide, or any combination thereof. Additionally, the dielectric layer 104 can be silicon dioxide, tetraethylorthosilicate (TEOS) oxide, high aspect ratio plasma (HARP) oxide, silicon oxide, high temperature oxide (HTO), high density plasma (HDP) oxide, oxides formed by an ALD process, or any combination thereof, and insulating liners, for example, silicon nitride (SiN), SiOCN, or SiBCN.

The substrate 102 can have a height of, for example, about 100 microns (μm) to about 500 microns (μm) from a bottom surface to a top surface of the substrate 102. The dielectric layer 104 can have a height of about 2 nanometers (nm) to about 300 nanometers (nm) from a bottom surface to a top surface of the dielectric layer 104.

FIG. 1 also illustrates a carbon nanotube (CNT) layer 106 disposed on the dielectric layer 104. The CNT layer 106 can include, but is not necessarily limited to, highly-purified carbon nanotube materials with various densities, and can be formed by drop casting a CNT solution on the dielectric layer 104. Alternatively, the CNT layer 106 can be formed by aligning or growing CNTs on the dielectric layer 104. Alternatively, according to an embodiment, a plurality of CNT layers that are spaced apart from each other in the horizontal direction can be formed on the dielectric layer 104, instead of a continuous CNT layer 106 as shown.

Figure 2:
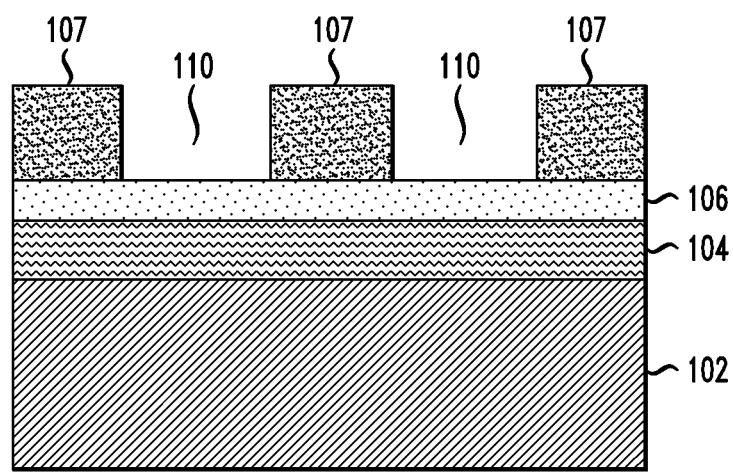
FIG. 2 is a cross-sectional view illustrating a dielectric layer formed on a CNT layer, and trenches formed in the dielectric layer, in a method for manufacturing a semiconductor device, according to an exemplary embodiment of the present invention.

FIG. 2 is a cross-sectional view illustrating a dielectric layer formed on the CNT layer, and trenches formed in the dielectric layer, in a method for manufacturing a semiconductor device, according to an exemplary embodiment of the present invention. Referring to FIG. 2, a dielectric layer 107 comprising, for example, hydrogen silsesquioxane (HSQ), is deposited on the CNT layer 106 and a portion of the dielectric layer 104 using any suitable method including, but not necessarily limited to, PECVD, ALD, or spin-coating and baking onto the underlying layer(s). The dielectric layer 107 protects portions of the device, including the CNT layer 106, when, for example, depositing subsequent layers on the device.

According to an embodiment of the present invention, portions of the dielectric layer 107 are removed using electron beam (e-beam) lithography to expose portions of the underlying CNT layer 106 in desired areas, forming trenches 110 where source/drain contact regions will be formed. Alternatively, a suitable etching process, such as, for example, isotropic or anisotropic etches, such as reactive ion etching (RIE), can be used to pattern the trenches 110.

Figure 3:
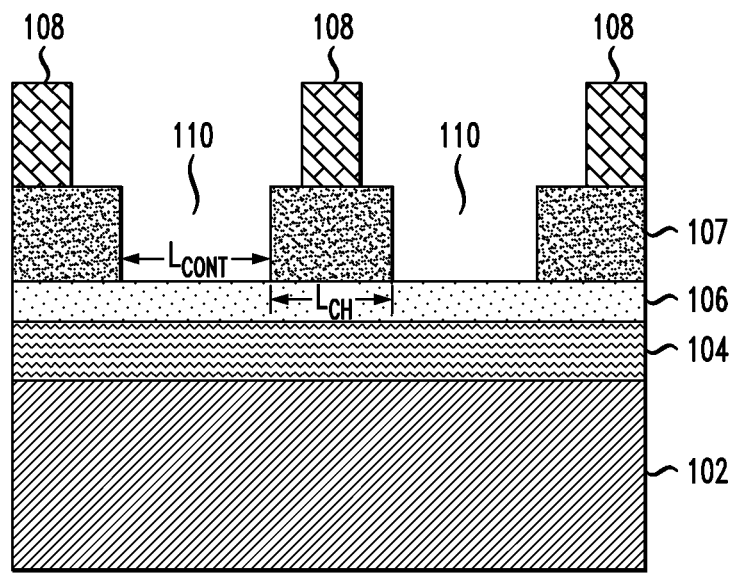
FIG. 3 is a cross-sectional view illustrating a patterned resist layer formed on the dielectric layer, in a method for manufacturing a semiconductor device, according to an exemplary embodiment of the present invention.

Referring to FIG. 3, according to embodiments of the present invention, the trenches 110 can have a contact length ($L_{cont}$) of about 5 nanometers (nm) to about 1000 nanometers (nm), such as, about 10 nanometers (nm) to about 100 nanometers (nm), but not necessarily limited thereto. As shown, more than one trench 110 can be formed. For example, multiple trenches 110 that are spaced apart from each other are illustrated at different portions of the CNT layer 106. The embodiments of the present invention are not limited to the illustrated number of trenches 110, and may include more or less trenches. According to an embodiment, a distance between each trench, or channel length ($L_{ch}$), can be, but is not necessarily limited to, about 5 nanometers (nm) to about 1000 nanometers (nm), such as, about 10 nanometers (nm) to about 150 nanometers (nm).

FIG. 3 is a cross-sectional view illustrating a resist 108 formed on portions of the dielectric layer 107, in a method for manufacturing a semiconductor device, according to an exemplary embodiment of the present invention. The resist 108 masks portions of the dielectric layer 107 when forming contact metal layers on the device. In accordance with an embodiment of the present invention, the resist 108 can be about 50 nanometers (nm) to about 1000 nanometers (nm) in height from a bottom surface to a top surface of the resist 108. The resist layer 108 can be deposited by any suitable method depending on the type of material, the methods including, but not necessarily limited to, PECVD, ALD, or spin-coating and baking onto the underlying layer(s).

In order to form the configuration shown in FIG. 3, portions of the resist 108 can be selectively removed by, for example, using electron beam lithography processing steps. For example, the resist 108 can be a polymethyl methacrylate (PMMA) resist, which is moldable and removable using electron beam lithography, but any other suitable resist can be used. According to embodiments of the present invention, the resist 108 can include, but is not necessarily limited to, a photoresist, electron-beam resist, ion-beam resist, X-ray resist, and an etchant resist, and may comprise polymeric spin-on or polymeric materials.

Figure 4:
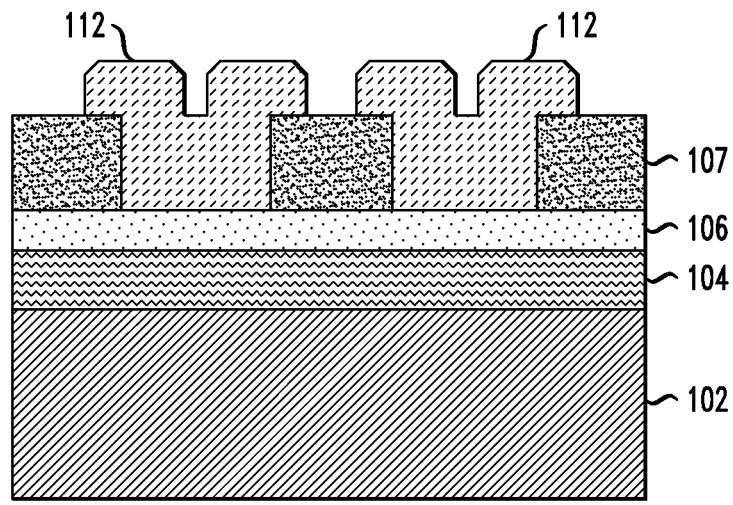
FIG. 4 is a cross-sectional view illustrating contact metal formation, in a method for manufacturing a semiconductor device, according to an exemplary embodiment of the present invention.

FIG. 4 is a cross-sectional view illustrating contact metal formation, in a method for manufacturing a semiconductor device, according to an exemplary embodiment of the present invention. Referring to FIG. 4, contact metal layers 112 are deposited between the remaining portions of the resist 108 and the dielectric layer 107 in the trenches 110 using, for example, a suitable deposition technique, such as, for example, CVD, PECVD, RFCVD, PVD, ALD, MLD, MBD, PLD, and/or LSMCD, sputtering, and/or plating. As shown in FIG. 4, following deposition of the contact metal 112, the resist 108 can be removed, or lifted off, from the dielectric layer 107 using, for example any suitable method of removing the resist 108 including, but not necessarily limited to, e-beam lithography, ashing and isopropyl alcohol (IPA) processing.

In some aspects, acetone, for example, hot acetone at a temperature of about 60° C.-about 80° C. can be used to lift-off the remaining resist 108. Additionally, in some aspects, the contact metal 112 can be planarized prior to or after removal of the resist 108. Planarization can be performed using, for example, chemical mechanical planarization (CMP).

Figure 5:
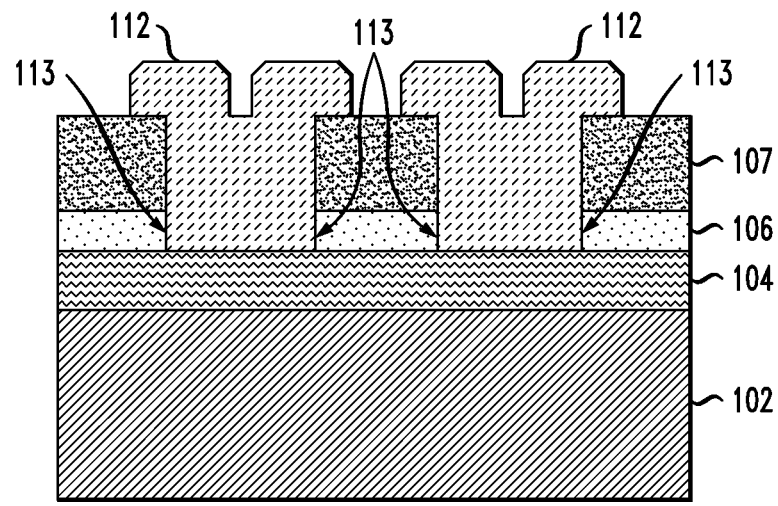
FIG. 5 is a cross-sectional view illustrating formation of end-bonded contacts following a thermal annealing process, in a method for manufacturing a semiconductor device, according to an exemplary embodiment of the present invention.

FIG. 5 is a cross-sectional view illustrating formation of end-bonded contacts following a thermal annealing process, in a method for manufacturing a semiconductor device, according to an exemplary embodiment of the present invention. Once the contacts 112 are deposited and the resist 108 is removed, a thermal annealing process is performed at a pre-determined temperature or temperature range to create end-bonds between the contacts 112 and the CNT layer 106 on which they are formed. As shown in FIG. 5, the thermal annealing process drives the CNT material to migrate or diffuse into the metal contacts 112, thereby creating an end-bonded contact 112 with contact interface surfaces 113 between a contact 112 and the CNT layer 106 only at ends of the contact 112 on lateral sides of the contacts 112. For example, according to an embodiment of the present invention, the carbon nanotubes that were beneath the contacts 112 are entirely dissolved into the contacts 112. The carbon nanotubes, which have a small diameter (e.g., ~1 nm), dissolve into contacts 112 having much larger dimensions relative to the carbon nanotubes to form end-bonded contacts.

The contacts 112, which function as source/drain contacts between channel regions for resulting transistors of the device, can be formed of any suitable metal. In some aspects, the contact metal has a sufficiently high solubility of carbon such that the CNT can dissolve into the metal contact during a thermal annealing process. In particular, the contact metal can be a metal that has a sufficiently high solubility of carbon such that the CNT can dissolve into the metal contact during a relatively low-temperature thermal annealing.

Additionally, the metal can be selected such that the metal does not form a carbide at relatively low thermal annealing temperatures. Specifically, thermal annealing steps are traditionally performed at high temperatures (such as greater than about 1000° C.) and relatively low thermal annealing temperatures are sought in order to lower the risk of damaging devices with the high temperatures. As such, in some aspects, the contact metal can be selected such that no carbides are formed during a thermal annealing process at a desired temperature of less than about 1000° C. By way of non-limiting example, a metal can be selected that does not form a carbide at a thermal annealing temperature of about 400° C. to about 600° C. Accordingly, the contact metal will form end-bonded metal contacts near the original contact edge and will not form a carbide contact surface.

A metal that has high CNT solubility and resists carbide formation at relatively low temperatures (e.g., about 400° C. to about 600° C.) can be used to form the contacts 112. In some aspects, the contacts 112 may comprise any of nickel (Ni), cobalt (Co), iron (Fe), copper (Cu), gold (Au), silver (Ag), ruthenium (Ru), palladium (Pd), platinum (Pt), iridium (Ir), and any mixtures or alloys thereof. For example, according to non-limiting embodiments of the present invention, the metal for the contacts 112 can be cobalt. A contact length ($L_{cont}$) of the metal contacts 112 can be, for example, about 40 nm, but is not necessarily limited thereto. According to a non-limiting embodiment, the cobalt contacts are annealed at about 600° C. for about 5 minutes.

Figure 6:
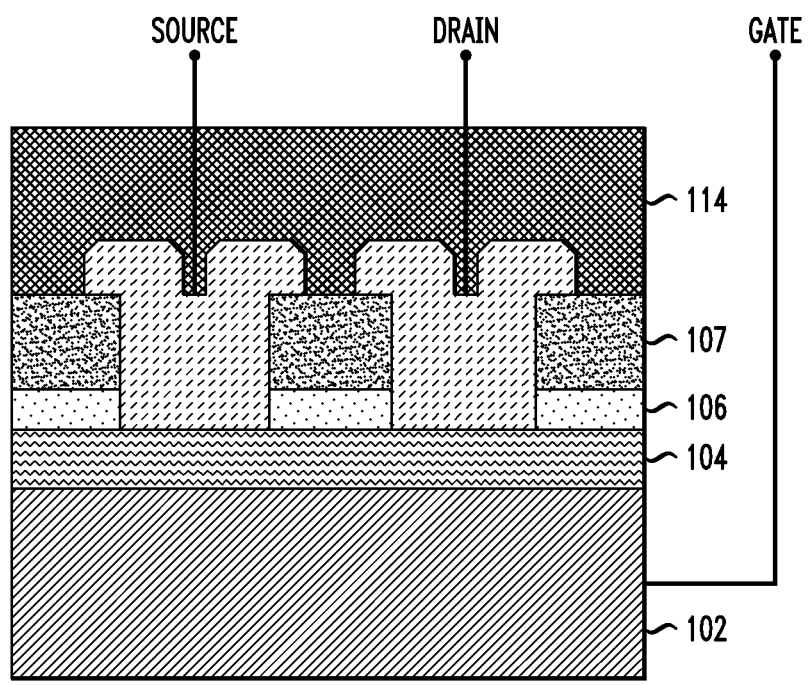
FIG. 6 is a cross-sectional view illustrating deposition of a passivation layer in a method for manufacturing a semiconductor device, according to an exemplary embodiment of the present invention.

FIG. 6 is a cross-sectional view illustrating deposition of a passivation layer in a method for manufacturing a semiconductor device, according to an exemplary embodiment of the present invention. Referring to FIG. 6, a passivation layer 114 is deposited on the contacts 112 and the dielectric layer 107. The passivation layer 114 is deposited using, for example, a suitable deposition technique, such as, for example, CVD, PECVD, RFCVD, PVD, ALD, MLD, MBD, PLD, and/or LSMCD, sputtering, and/or plating. The deposition technique may depend on the material used for the passivation layer 114. According to an embodiment of the present invention, the passivation layer 114 comprises a dielectric, such as, for example, an oxide or a nitride. For example, the passivation layer 114 includes, but is not necessarily limited to, aluminum oxide ($Al_2O_3$) or hafnium oxide ($HfO_2$) deposited using ALD. A height of the passivation layer 114 from a bottom surface to a top surface thereof can be in the range of about 5 nm to about 100 nm, for example, about 20 nm, depending on the height of the contacts 112 to allow a top surface of the passivation layer 114 to be higher than a top surface of the contacts 112. The passivation layer 114 functions as an n-type physicochemical doping layer and enables the formation of robust n-type metal contacts end-bonded to CNTs by converting p-type contacts 112 to n-type contacts.

After deposition of the passivation layer 114, for the convenience of electrical probing and measurement, the contact pad (e.g., non-device) area may be opened by wet etching to selectively remove the passivation layer 114.

FIGS. 7A and 7B show graphs of source/drain current versus gate voltage in connection with end-bonded metal contacts without the passivation layer and with the passivation layer, according to an exemplary embodiment of the present invention. As can be seen in a comparison of FIGS. 7A and 7B, CNT transistors without a passivation layer (e.g., passivation layer 114) deposited thereon exhibit substantially complementary profiles to CNT transistors with a passivation layer due to the difference in doping (e.g., p-type vs. n-type) between the sets of transistors represented in FIGS. 7A and 7B.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:
1. A semiconductor device, comprising:
a first dielectric layer on a substrate;
a carbon nanotube layer on the first dielectric layer;
a second dielectric layer on the carbon nanotube layer;
wherein the second dielectric layer comprises hydrogen silsesquioxane;
a plurality of contacts end-bonded to the carbon nanotube layer, wherein the plurality of the contacts are positioned in a plurality of trenches in the second dielectric layer, are n-type contacts and comprise cobalt;
wherein the carbon nanotube layer comprises a plurality of carbon nanotube layer portions spaced apart from each other;
wherein, in a cross-section, the second dielectric layer comprises a plurality of second dielectric layer portions spaced apart from each other;
wherein each of the plurality of trenches is bordered by two second dielectric layer portions of the plurality of second dielectric layer portions on opposing vertical sides of each of the plurality of trenches; and
a passivation layer on the plurality of the contacts and the second dielectric layer;
wherein the passivation layer comprises a different material than the second dielectric layer;
wherein the two second dielectric layer portions comprise opposite lateral sides parallel to each other and to opposite lateral sides of respective ones of the plurality of carbon nanotube layer portions;
wherein each of the plurality of the contacts includes respective portions having a bottom surface on a top surface of an underlying one of the plurality of second dielectric layer portions; and
wherein an entire width of each of the respective portions overlaps an underlying one of the plurality of carbon nanotube layer portions.

2. The semiconductor device according to claim 1, wherein the passivation layer comprises aluminum oxide ($Al_2O_3$).

3. The semiconductor device according to claim 1, wherein a contact length of each of the plurality of the contacts is about 10 nanometers to about 100 nanometers.

4. The semiconductor device according to claim 3, wherein a contact length of each of the plurality of the contacts is about 40 nanometers.

5. The semiconductor device according to claim 1, wherein a diameter of the carbon nanotube layer is about 1 nanometer.

6. The semiconductor device according to claim 1, wherein each of the plurality of the contacts includes an additional portion having a bottom surface on and contacting a top surface of the first dielectric layer.

7. The semiconductor device according to claim 1, wherein the plurality of the contacts each comprise a resulting structure of dissolving a carbon nanotube into a contact of the plurality of contacts.

8. The semiconductor device according to claim 1, wherein each of the plurality of the contacts comprises a T-shape.

9. The semiconductor device according to claim 1, wherein a first lateral side of the passivation layer is aligned with a lateral side of a given second dielectric layer portion of the plurality of second dielectric layer portions, and wherein a second lateral side of the passivation layer is aligned with a lateral side of another second dielectric layer portion of the plurality of second dielectric layer portions.

10. The semiconductor device according to claim 1, wherein the plurality of contacts further comprise carbon.

11. A semiconductor device, comprising:
a first dielectric layer on a substrate;
a carbon nanotube layer on the first dielectric layer;
a second dielectric layer on the carbon nanotube layer;
wherein the second dielectric layer comprises hydrogen silsesquioxane; and
a plurality of contacts end-bonded to the carbon nanotube layer, wherein the plurality of the contacts are positioned in a plurality of trenches in the second dielectric layer, are n-type contacts and comprise cobalt;
wherein the carbon nanotube layer comprises a plurality of carbon nanotube layer portions spaced apart from each other;
wherein, in a cross-section, the second dielectric layer comprises a plurality of second dielectric layer portions spaced apart from each other;
wherein each of the plurality of trenches is bordered by two second dielectric layer portions of the plurality of second dielectric layer portions on opposing vertical sides of each of the plurality of trenches;
wherein the two second dielectric layer portions comprise opposite lateral sides parallel to each other and to opposite lateral sides of respective ones of the plurality of carbon nanotube layer portions;
wherein each of the plurality of the contacts includes respective portions having a bottom surface on a top surface of an underlying one of the plurality of second dielectric layer portions; and
wherein an entire width of each of the respective portions overlaps an underlying one of the plurality of carbon nanotube layer portions.

12. The semiconductor device according to claim 11, wherein a contact length of each of the plurality of the contacts is about 10 nanometers to about 100 nanometers.

13. The semiconductor device according to claim 12, wherein a contact length of each of the plurality of the contacts is about 40 nanometers.

14. The semiconductor device according to claim 11, wherein a diameter of the carbon nanotube layer is about 1 nanometer.

15. The semiconductor device according to claim 11, wherein each of the plurality of the contacts includes an additional portion having a bottom surface on and contacting a top surface of the first dielectric layer.

16. The semiconductor device according to claim 11, wherein the plurality of the contacts each comprise a resulting structure of dissolving a carbon nanotube into a contact of the plurality of contacts.

17. The semiconductor device according to claim 11, wherein each of the plurality of the contacts comprises a T-shape.

18. The semiconductor device according to claim 11, further comprising a passivation layer on the plurality of contacts and the second dielectric layer, wherein a first lateral side of the passivation layer is aligned with a lateral side of a given second dielectric layer portion of the plurality of second dielectric layer portions, and wherein a second lateral side of the passivation layer is aligned with a lateral side of another second dielectric layer portion of the plurality of second dielectric layer portions.

19. The semiconductor device according to claim 11, wherein the plurality of contacts further comprise carbon.

* * * * *